United States Patent
Chuang et al.

(10) Patent No.: US 9,722,084 B2
(45) Date of Patent: Aug. 1, 2017

(54) METHOD FOR FORMING A GLASS SUBSTRATE WITH A DEPLETED SURFACE LAYER AND POLYCRYSTALLINE-SILICON TFT BUILT THEREON

(71) Applicant: Corning Incorporated, Corning, NY (US)

(72) Inventors: Ta-Ko Chuang, San Jose, CA (US); Yunfeng Gu, Painted Post, NY (US); Robert George Manley, Vestal, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/787,394

(22) PCT Filed: Apr. 25, 2014

(86) PCT No.: PCT/US2014/035428
§ 371 (c)(1),
(2) Date: Oct. 27, 2015

(87) PCT Pub. No.: WO2014/179163
PCT Pub. Date: Nov. 6, 2014

(65) Prior Publication Data
US 2016/0071981 A1    Mar. 10, 2016

Related U.S. Application Data

(60) Provisional application No. 61/817,536, filed on Apr. 30, 2013.

(51) Int. Cl.
*H01L 29/786* (2006.01)
*H01L 29/66* (2006.01)
(Continued)

(52) U.S. Cl.
CPC ...... *H01L 29/78603* (2013.01); *C03C 23/008* (2013.01); *C03C 25/66* (2013.01);
(Continued)

(58) Field of Classification Search
CPC ......... H01L 29/78603; H01L 21/32133; H01L 29/66757; H01L 21/02667; H01L 29/495;
(Continued)

(56) References Cited

U.S. PATENT DOCUMENTS 4,180,618 A    12/1979    Alpha et al.
4,485,146 A    11/1984    Mizuhashi et al.
(Continued)

FOREIGN PATENT DOCUMENTS

JP    0200809461 A    *    4/2008    ............. C03C 23/00
KR    2012004912 A    1/2012

OTHER PUBLICATIONS

Couillard et al.; "Chemical treatment of glass substrates"; Journal of Non-Crystalline Solids 222 (1997), pp. 429-434.
(Continued)

*Primary Examiner* — Thanh T Nguyen
(74) *Attorney, Agent, or Firm* — Kevin M. Abie (57) ABSTRACT

There is disclosed a method for chemically treating a display glass substrate by treating at least one surface of the glass substrate with a heated solution containing HCl to form a depletion layer at the surface and under the surface of the glass substrate. The disclosure also relates to display glass substrates containing the depletion layer made by the disclosed process. In addition, the disclosure relates to methods of making thin-film transistors ("TFTs") on these display glass substrates by depositing a Si layer directly on the chemically treated surface of the glass substrate, and annealing the Si layer to form polycrystalline silicon.

18 Claims, 6 Drawing Sheets

(51) Int. Cl.
*C03C 23/00* (2006.01)
*C03C 25/66* (2006.01)
*C03C 25/70* (2006.01)
*H01L 21/02* (2006.01)
*H01L 21/28* (2006.01)
*H01L 21/3213* (2006.01)
*H01L 21/324* (2006.01)
*H01L 21/768* (2006.01)
*H01L 29/04* (2006.01)
*H01L 29/16* (2006.01)
*H01L 29/49* (2006.01)
*H01L 29/51* (2006.01)

(52) U.S. Cl.
CPC ........ *C03C 25/70* (2013.01); *H01L 21/02422* (2013.01); *H01L 21/02532* (2013.01); *H01L 21/02595* (2013.01); *H01L 21/02667* (2013.01); *H01L 21/28* (2013.01); *H01L 21/324* (2013.01); *H01L 21/32133* (2013.01); *H01L 21/76802* (2013.01); *H01L 29/04* (2013.01); *H01L 29/16* (2013.01); *H01L 29/495* (2013.01); *H01L 29/51* (2013.01); *H01L 29/66742* (2013.01); *H01L 29/66757* (2013.01); *H01L 29/78606* (2013.01)

(58) Field of Classification Search
CPC ............... H01L 29/51; H01L 21/02532; H01L 21/76802; H01L 21/02595; H01L 21/28; H01L 21/02422; H01L 21/324; H01L 29/16; H01L 29/04; C03C 25/66; C03C 25/70; C03C 23/008
See application file for complete search history.

(56) References Cited

U.S. PATENT DOCUMENTS

| | | |
|---|---|---|
| 5,093,196 A | 3/1992 | Hecq et al. |
| 5,578,103 A | 11/1996 | Araujo et al. |
| 5,792,327 A | 8/1998 | Belscher et al. |
| 5,851,366 A | 12/1998 | Belscher et al. |
| 5,985,700 A | 11/1999 | Moore |
| 6,849,872 B1 | 2/2005 | Yamazaki et al. |
| 7,402,467 B1 | 7/2008 | Kadono et al. |
| 2001/0039810 A1* | 11/2001 | Eda .................. C03C 17/06 65/30.14 |
| 2009/0003051 A1* | 1/2009 | Fujita .............. G06F 12/0891 365/174 |
| 2012/0244388 A1 | 9/2012 | Nakashima et al. |
| 2013/0079732 A1 | 3/2013 | Burt et al. |
| 2013/0109116 A1 | 5/2013 | Cavuoti et al. |

OTHER PUBLICATIONS

Korean Intellectual Property Office; Intgernational Search Report; Mail Date: Aug. 28, 2014; pp. 1-3.

Tian et al. "Bulk diffusion measurements to study the effectiveness of barrier layers: II. Exchange of sodium between liquid crystal display glass substrates with different barrier layers" J Appl Phys 90(8) (2001) 3810.

Wang et al. "The effects of SiO2 barrier between active layer and substrate on the performance and reliability of polycrystalline silicon thin film transistors" Microelectronics Reliability 38 (1998) 1835.

\* cited by examiner

METHOD FOR FORMING A GLASS SUBSTRATE WITH A DEPLETED SURFACE LAYER AND POLYCRYSTALLINE-SILICON TFT BUILT THEREON

This application claims the benefit of priority under 35 U.S.C. §119 of U.S. Provisional Application Ser. No. 61/817,536 filed on Apr. 30, 2013, the content of which is relied upon and incorporated herein by reference in its entirety.

FIELD OF THE DISCLOSURE

The disclosure relates generally to a glass substrate having a surface layer depleted of certain materials and devices (e.g. thin film transistors) built in such glass substrates. Methods for chemically treating such glass substrates to obtain a depleted surface layer are also disclosed. Exemplary methods include treating the glass substrate with a heated solution containing HCl to form a depletion layer at the surface and/or under the surface of the glass substrate.

BACKGROUND

Today's display glass substrates are delivered to customers with minimal treatment, or sometimes no treatment at all. Most of the glass substrates are cut to size and are then washed using an aqueous surfactant solution. This solution is designed to help remove glass and abrasive particles that are deposited on the glass surface during the cutting and edge grinding of the glass. Such washing does not offer any further benefit to thin-film transistors ("TFTs").

Metallic impurities at or within the top surface layer of a glass substrate can degrade the performance of thin film transistors (TFTs) and other electronic devices fabricated on the substrate. For example, metallic impurities present at the glass/semiconductor interface can cause an increase in the leakage current between the source and drain electrodes. If metallic impurities become incorporated into the semiconductor film at levels close to the designed free carrier concentration, reduced gate control may occur, as well as an increase in current leakage and other erratic operation characteristics. The concentration of these metallic impurities exceeding the designed free carrier concentration may lead to complete device failure due to an open circuit or short circuit condition. Metallic impurities contaminating the gate insulator can also lead to erratic threshold voltage variation and/or premature dielectric breakdown and destruction of the transistor.

SUMMARY

The disclosure relates, in various embodiments, to glass substrates having a surface layer depleted of certain materials, and electronic devices, such as visual display devices including thin film transistors manufactured using such glass substrates with a depleted surface layer. Methods for chemically treating a glass substrate, for example by leaching, to impart a depletion layer, or a silica rich barrier layer, on the glass surface without negatively impacting the surface roughness and/or other properties important to electronic fabrication, such as thin-film transistor ("TFT") fabrication, are also disclosed.

Therefore, one embodiment discloses a method of chemically treating the surface layer of a glass substrate, the method including contacting at least the surface of the glass substrate with a heated solution comprising HCl for a time sufficient to leach at least one element from the surface and/or from below the surface of the glass substrate.

When the glass substrate comprises a typical display glass, such as an alkaline earth boroaluminosilicate glass, the elements removed from the substrate during leaching can include alkaline earth metals, boron, aluminum, or metallic contaminants, for example Na, K, Mg, Ca, Sr, Ba, Fe, Cu, B, Al, Sn, P, As or Sb.

The disclosure also relates to a display glass substrate including an alkaline earth boroaluminosilicate having a chemically treated surface layer with a depth ranging from about 1 nanometer (nm) to about 200 nm. In one embodiment, the chemically treated surface layer is substantially depleted of at least one element chosen from an alkaline earth metal, boron, aluminum, or a metallic contaminant.

There is also disclosed a method of making a TFT by directly depositing a Si layer on the chemically treated surface layer of the display glass substrate, and depositing additional conducting, semi-conducting and/or insulating layers known to one skilled in the art.

Additional features and advantages will be set forth in the following detailed description, and in part will be readily apparent to those skilled in the art from the description or recognized by practicing the embodiments as described in the written description and claims hereof, as well as the appended drawings. It is to be understood that both the foregoing general description and the following detailed description are merely exemplary, and are intended to provide an overview or framework to understand the nature and character of the claims.

BRIEF DESCRIPTION OF THE DRAWINGS

The accompanying drawings are included to provide a further understanding of the disclosure, and are incorporated in and constitute a part of this specification. The drawings illustrate one or more exemplary embodiments and, together with the description, serve to explain the principles and operation of the various embodiments.

FIG. 3A shows the ratio of Si to Al, while FIG. 3B shows the ratio of Si to Ba.

DETAILED DESCRIPTION

The term "depletion layer," and other variations thereof, is used herein to describe an area of the substrate in which a majority of charge carriers have been removed by leaching. Non-limiting examples of such charge carriers that are removed from the depletion layer according to the present disclosure include Al, B, alkaline earth metals, and metallic contaminants such as Na, K, Mg, Ca, Sr, Ba, Fe, Cu, B, Al, Sn, P, As or Sb. When the depletion layer is depleted and/or substantially free of charge carriers, leaving none to carry a current, it is sometimes referred to as an "insulating layer."

The term "silica enrichment," and variations thereof, is used herein to denote the increase of the ratio of silica to glass constituents resulting from the process by which glass constituents are removed from the depletion layer.

The term "FET," and variations thereof, are used herein to denote a field-effect transistor.

The term "ringFET," and variations thereof, are used herein to denote a ring field-effect transistor, which is a FET device with three concentric, co-planar electrodes that comprise the source, gate and drain of the ring field-effect transistor.

The term "TFT," and variations thereof, are used herein to denote a thin-film transistor.

The phrase "elevated temperature," and variations thereof, is used herein to denote a temperature above room temperature, such as above 21° C., for example above 40° C.

The term "leach depth," and variations thereof, are used herein to denote the depth below the surface of the substrate at which leaching of impurities occurs.

The term "top gate," and variations thereof, is used herein to denote a device wherein the gate metal is on top, and the source-drain semiconductor region is in contact with the substrate.

The properties of the glass substrates are of prime importance to the performance and reliability of thin film transistors and photovoltaic cells. (Ellison and Cornejo, Int. J Appl. Glass Sci 1[1] (2010) 87). Sodium migrating from alkali containing glasses was found to poison the liquid crystal and degrade the ITO layers used in active matrix liquid crystal display (AMLCD) panels, and leads to shunting in photovoltaic cells deposited on glass. Even with low alkali glasses, it was found the repeated on-off cycles would lead to sodium migration.

Various methods were developed to mitigate the detrimental impacts of alkalis either by removing alkalis from the base glass, or the glass surface, or by use of barrier layers to prevent alkali migration. Alpha and Dumbaugh describe in U.S. Pat. No. 4,180,618 alkaline earth aluminosilicate glasses for use in polysilicon photovoltaics. Hecq, et. al. describe in U.S. Pat. No. 5,093,196 a less reactive soda lime glass having a dealkalized layer and a method to create this dealkalized layer by high temperature reaction with an acid gas. The depleted region of alkalis extends over 100 nm into the glass. Mizuhashi et. al. in U.S. Pat. No. 4,485,146 teaches that a silica barrier layer deposited on an alkali containing glass may be used to prevent diffusion of sodium from the glass to the semiconductor layer if it contains hydrogen bound to silicon. Couillard et. al. describe in SPIE 3014 166 that leakage currents of p-Si TFT's deposited on Corning code 1737 glass increase with increasing barrier layer thickness. The apparent cause of this counterintuitive result is explained by Araujo et. al. in U.S. Pat. No. 5,578, 103. The direction of alkali metal flow in a glass with a silica, alumina, or tantala barrier layer depends on the glass composition. For glasses with high field strength ions that can change coordination, flow can be from the barrier to the glass, driven by the energy change in coordination.

Impurities diffusing from the glass impact the performance of the silicon TFT's as well, especially for polysilicon (pSi) transistors where processing temperatures often exceed 600° C. In U.S. Pat. No. 5,985,700 Moore teaches a method for leaching a glass surface to reduce off-state leakage current by 2 orders of magnitude without an additional barrier layer by simply using a RCA cleaning process (developed in 1965 by the RCA Corporation as a cleaning method for semiconductor wafers prior to high temperature processing) without an hydrofluoric acid (HF) dip. Secondary ion mass sprectroscopy (SIMS) and inductively coupled plasma mass spectroscopy (ICP-MS) show basic RCA removes mostly aluminum and some calcium, whereas the acidic RCA2 removes calcium, barium, and aluminum from Corning code 1737 glass. Couillard et. al. describe in J. Non-Cryst. Solid 222 (1997) 429 how the RCA cleaning of Corning code 1737 glass forms a silica rich layer ~6 nm thick. X-ray photoelectron spectroscopy (XPS) measurements are used to show that RCA treatment increases silica content by ~17% while decreasing alumina 50%, boron 20% and Ba 67%. Tian et. al. in J. Appl. Phys. 90(8) (2001) 3810 describes Na22 tracer diffusion experiments which show that RCA cleaning and surface modification of 1737 by wet oxidation at 650° C. both act like low pressure chemical vapor deposition (LPCVD) $SiO_2$, as an effective barrier layer to sodium diffusion.

As described above, efforts to reduce impurities from the glass impacting TFT devices have focused on alkali metals, primarily sodium migration. However, contamination other than alkali metals can have detrimental impact on TFT performance and the contamination impacts more than higher leakage current. Impurities incorporated into the semiconductor create trap states, some of which will be donors or acceptors. For silicon, incorporation of trivalent group 3, 8, and 13 elements produce acceptors, and incorporation of pentavalent group 5 and 15 elements produce donors. This increase in the background doping of the semiconductor will not only increase the off current of a thin film transistor, but also shift the threshold voltage. Spatial and run-to-run variation in contamination levels can have direct impact on the yield of AMLCD display panel production as consistent transistor characteristics such as threshold voltage and on-off currents are essential for integration with simple driver circuits. This is especially true in p-Si TFT's where there is already considerable variation due to grain size distributions. This impact is further magnified in the case of p-Si TFTs driving organic light emitting diodes (OLEDs). Since OLEDs are a current driven device, variations in threshold voltage will result in variations in pixel intensity. Other impurities will create deeper level trap states. These traps mostly impact carrier transport. Since all elements except silicon can create trap states in silicon, it would seem that quartz or high purity fused silica would be the ideal substrate for thin film transistors. However, the price is prohibitive, and other properties such as thermal expansion mismatch with the silicon and silicon nitride barriers make high purity fused silica impractical. Achieving thermal expansion, price, and forming targets requires that elements such as aluminum, boron, and alkaline earths that can have detrimental impact on thin film transistors must be incorporated into flat glass substrates for flat panel displays.

Accordingly, methods that form a surface layer depleted of elements which have detrimental impact on thin film transistor performance depleted layers in glass substrates have been developed. Such treatments may or may not include glass leaching followed by heat treatment, or other means. Such treatments will be such that strength and scratch resistance during normal processing of glass sheets for display applications will not be compromised. Beneficially, the treatment used is such that all of the above attributes will be improved with one glass surface material composition.

During leaching, invading ions from a fluid medium in which the glass is disposed enter the glass structure through the interstices and exchange sites with host ions in the glass on a no-net-transfer-of-electrical-charge basis. In turn, host ions of the glass work their way gradually to the glass surface. Leaching of alkali ions is the dominant durability problem. The leaching process is interdiffusion-controlled, and the amount of component in the leachate would go up as a function of $t^{0.5}$, where t is time. This is thought to occur in acidic conditions. In basic solutions, glass structures are thought to break bridging oxygen, resulting in gradual dissolution of the network. The rate of such a corrosion reaction is thought to occur linearly in time. When the dissolution is uniform, the ratio of the various species in the attacking medium is the same as in the glass. Preferential dissolution occurs because of the phase microstructure of glass. Some regions of the glass contain compositions that are more readily attacked by the medium than others. In such a case, the ratio of the dissolved species in the medium would be different than that of the parent glass. In all of the above cases, it is mentioned that the rate of attack is a thermally activated process where the amount of material extracted at a temperature T follows an Arrhenius type expression. For most sodium silicate glasses, the rate increases by a factor of 1.5 to 2 for every 10° C. rise in temperature.

TFT fabrication on glass surfaces that have been modified in such a way has been explored less thoroughly. Surface treatments are also described by Belscher et. al. in U.S. Pat. No. 5,792,327 and U.S. Pat. No. 5,851,366. These patents describe how the adherence of a metal film directly on a glass substrate may be improved by chemically treating the surface with a mixture of hydrofluoric and hydrochloric acid. Creation of a silica rich barrier by RCA treatment has been described by Moore, Couilard and Tian as referenced above. Moore in U.S. Pat. No. 5,985,700 discloses the use of leaching to provide a silica rich boundary area at the glass surface, after which the source drain semiconductor region is deposited directly onto the glass surface without a barrier layer. The patent discusses use of liquids or gases having a pH between 0 and 6 and/or 8-14 to form a leached surface, forming a silicon coating directly onto said leached glass surface, patterning said silicon coating to form the base of said TFT and finishing the TFT device. The impact of this RCA clean-created barrier on the properties of thin film transistors has been explored in Wang et. al Microelectronics Reliability 38 (1998) 1835. RCA cleaning defined as exposure of the glass to $NH_4/H_2O_2/H_2O$ for 10 minutes at 75° C. followed by exposure of the glass to $HCl/H_2O_2/H_2O$ for 10 min at 75° C. resulted in enhanced performance in hot carrier mobility due to the presence of a buffer layer. Comparing between Corning code 1737 glass RCA cleaned or $SiO_2$ coated by atmospheric pressure chemical vapor deposition (APCVD) and LPCVD to various thicknesses, performance and hot carrier stress reliability for n-TFTs on $SiO_2$ coated 1737 was better than on uncoated 1737 glass.

The hot carrier stress reliability performance depends again on $SiO_2$ coating thickness. Impurity traps were controlled by the absence or presence of coating while the grain boundary traps are proposed to be sensitive to compressive or tensile stresses in the coating, which are thought to depend on coating thickness.

The mechanisms of glass contamination of TFT devices are not well documented. Published work has focused on diffusion, primarily in the high temperature deposition of p-Si, dopant activation, or recrystallization of amorphous silicon (a-Si) to p-Si. However, it is likely that other mechanisms contribute to contamination. Sputtering during plasma deposition, chemical vapor transport during CVD processes, dissolution and redeposition in wet processing, and surface contact are all plausible mechanisms by which the glass could contaminate a thin film transistor process. As device performance has increased, additional processes and structures which will not directly impact diffusion from the substrate have been disclosed to minimize the impact of contamination. Yamazaki et. al. in U.S. Pat. No. 6,849,872 describe an improved thin film transistor where the TFT is formed on a substrate with a silicon nitride, aluminum nitride, or aluminum oxide barrier layer, and encapsulated with a second barrier layer over the TFT. The purpose of these barrier layers is to prevent the transport of mobile ions from the substrate. Kadono et. al. describe in U.S. Pat. No. 7,402,467 and U.S. Pat. No. 7,871,936 a method to improve the reliability of TFT devices by removing contamination at each interface by etching with a dilute fluorine containing solution.

In one embodiment, there is disclosed a method of chemically treating the surface layer of a substrate, such as a glass substrate including an alkaline earth boroaluminosilicate glass used in display applications. The method includes contacting at least one surface of the substrate with a heated solution comprising HCl for a time sufficient to leach at least one element from the surface and/or from below the surface of the glass substrate. In one embodiment, the surface roughness of the glass substrate is substantially the same before and after the contacting with the heated HCl solution. Experimental evidence has shown that treating the surface of the glass substrate with an aqueous solution of dilute hydrofluoric acid (HF) prior to the leaching leads to enhanced efficacy of the leaching process.

In an etching process, an exterior layer is removed from the substrate, and the ratio of Si to charge carriers does not change before and after the etching process. In contrast, a leaching process selectively removes charge carriers from an exterior surface of a glass substrate, and the ratio of Si to charge carriers is increased after the leaching process.

When the glass substrate comprises an alkaline earth boroaluminosilicate glass, the elements removed therefrom by leaching may include an alkaline earth metal, boron, aluminum, or metallic contaminants, for example Na, K, Mg, Ca, Sr, Ba, Fe, Cu, B, Al, Sn, P, As or Sb. This leads to a chemically treated glass substrate that has a silica enrichment ranging from 4 to 15%. In one embodiment, the chemically treated glass substrate has a Si:Al ratio at least 20% higher after contacting with the heated HCl solution than before contacting. In one embodiment, the Si:Al ratio is in a range from about 80:20 to about 100:0.

In one embodiment, the disclosed method is used to remove contaminants both on the surface of the substrate, and within a certain depth of the substrate, which is referred to as "leach depth." Leach depths may extend into the substrate up to about 200 nm and in some embodiments up to about 500 nm. In one embodiment, the leach depth is in a range from about 1 to about 200 nm. In a particular embodiment, the leach depth is in a range from about 2 nm to about 5 nm.

The HCl solution used in the disclosed method typically has a concentration in a range from about 0.1 mole per liter to about 2.0 mole per liter. In some embodiments, the HCl solution is diluted with a diluent selected from $H_2O$ or $H_2O_2$ to obtain a ratio of HCl solution to diluent ranging from 1:2 to 1:10. In a particular embodiment, the ratio is 1:5 to 1:7.

The HCl solution disclosed herein is typically applied to the substrate at an elevated temperature. In one embodiment, the HCl solution temperature falls within a range from about 40° C. to about 80° C., for example in a range from about 60° C. to about 75° C.

In one embodiment, the time the HCl is in contact with the substrate (referred to as "contacting time") can range from about 1 minute to about 30 minutes. In one embodiment, the contacting time is measured in five minute increments starting at 5 minutes up to 30 minutes. Various forms of contacting may be employed, including but not limited to a stagnant soak or an agitated soak, including, for example, agitation by mechanical stirring or bubbling. The contacting step may also comprise a spray process, such as a horizontal or vertical spray process.

While not required, the substrate may be washed and cleaned prior to the contacting step using a traditional washing and cleaning step for display glass known to one skilled in the art. For example, a typical glass cleaning uses a combination of any of the following steps: detergent spray wash, brush wash, ultrasonic wash, megasonic wash, high-pressure wash, air knife dry, and IPA dry. The order of the washing steps can vary depending on the best practices for a particular application. One detergent wash uses a detergent-based alkaline solution, such as KOH.

Likewise, while not required, the substrate can be washed with heated, deionized water after contacting the substrate with the previously described HCl solution. In various embodiments, the deionized water may be heated to a temperature ranging from about 40° C. to about 80° C. This washing step may also be performed under ultrasonic or megasonic conditions, such as at a frequency ranging from about 70 kHz to greater than 1000 kHz and for a time ranging from about 1 minute to about 30 minutes. In one embodiment, this process is performed in a stagnant or recirculating bath with an ultrasonic and/or megasonic transducer. In another embodiment, this process is carried out using a conveyer tool with ultrasonic and/or megasonic spray nozzles. Finally, the leached and cleaned glass can be dried using known techniques, including with use of spin-rinse-drying ("SRD"), isopropanol ("IPA") drying ("Marangoni drying"), or combinations thereof to form a display glass substrate.

In one embodiment, the previously described method may be used to make a display glass substrate comprising an alkaline earth boroaluminosilicate having a chemically treated surface layer ranging from about 1 nm to about 200 nm in depth that is substantially depleted of at least one element chosen from an alkaline earth metal, boron, aluminum, or a metallic contaminant, for example Na, K, Mg, Ca, Sr, Ba, Fe, Cu, B, Al, Sn, P, As or Sb.

In another embodiment, there is disclosed a method of forming a thin-film-transistor ("TFT") on the disclosed substrate by a process that includes:

depositing a Si layer directly on the chemically treated surface of the glass substrate;

annealing the Si layer to form polycrystalline silicon;

depositing electrodes on the polycrystalline silicon, and patterning the electrodes to form channel regions;

depositing a dielectric layer, for example a $SiO_2$ layer, over the channel regions and the electrodes;

depositing a metal gate, for example an Al gate, on the $SiO_2$ layer, and patterning the gate;

etching via holes through the $SiO_2$ layer and over the electrodes; and annealing the sample.

The above process outlines one example of a TFT-forming process. The steps outlined may be performed in a different order and still allow for formation of the transistor. Other variations on the process outlined above include using a different dielectric material or materials for forming the dielectric layer, and/or using a different metal or metals for forming the metal gate.

As shown, and according to various embodiments of the disclosure, there is disclosed a chemical treatment of a display glass substrate, the method having a direct, positive impact on TFT performance. This particularly impacts the off-state operation, or operation below the threshold voltage, of the TFT, thereby reducing current leakage and improving transistor control for organic light-emitting diode (OLED) and other high performance display ("HPD") technologies. Improvements in the off-state operation of TFTs may also reduce the overall power consumption of devices.

In another embodiment, there is disclosed an apparatus, for example a chemical wet bench, a RCA wet bench or a chemical bath, to chemically treat display glass substrates such as EAGLE XG® and Corning Lotus™. The chemical solution is HCl, which can be diluted with $H_2O$ or $H_2O_2$ to control the level of surface treatment. Treatment time and temperature of the solution can also be used to control the level of treatment. HCl can react with many metals and remove them from the surface of the glass. HCl also has a leaching effect, which can remove metallic impurities below the surface of the glass. The level of metallic impurity removal from below the glass surface, referred to as the leach depth, can be controlled by treatment time, solution temperature and/or solution concentration.

By leaching an area to form a depletion layer extending into the glass substrate from the surface of the glass substrate, there is a lower probability that metal impurities will be present at or near the glass substrate surface to interact with thin film materials subsequently deposited on the glass surface. These impurities can reside at the glass/film interface or be incorporated into the film. This is particularly important for semiconductor films, as it is well known that metallic impurities form trap states within the bandgap of silicon and other semiconductors. These metallic impurities may therefore lessen the performance of the films and electronic devices, such as TFTs, fabricated with them by causing erratic device behavior, increased leakage current, reduced subthreshold swing and reduced gate control, which may ultimately cause a reduction in device reliability.

HCl attacks metallic impurities while maintaining the roughness of the fusion-drawn surface, thereby leading to a number of advantages. For example, the surface roughness for Lotus™ glass may be in a range from about 0.2 to about 0.3 nm. An increase in surface roughness may have adverse effects on the subsequently deposited films, for example delamination. In addition, maintaining an adequately low surface roughness can avoid the propagation of the roughness to the device layer. Roughness within the device layer may cause a shift in device characteristics or device malfunction.

Example, non-limiting advantages associated with the disclosed method include a reduction of particles on the glass substrate. More particularly, there can be a reduction of metallic impurities, both neutral and ionic, from the glass surface. In fact, by using the disclosed method, it is possible to achieve a reduction of metallic impurities, both neutral and ionic, from the top surface layer of the glass, and from a depletion or leach layer extending below the surface in a range from about 1 nm to hundreds of nanometers.

As previously described, the disclosed method leads to the formation of a depletion layer by using chemistries compatible with glass processing, thin-film transistor processing and semiconductor processing. In one example embodiment, the disclosed method is compatible with all thin-film transistor design schemes including top gate, bottom gate, co-planar and staggered schemes. For the same reasons, glass leaching equipment can be retrofitted into current glass cleaning equipment.

Some display glass substrates are chemically treated prior to delivery to customers. One such treatment includes a chemical solution of NaF and $H_3PO_4$. This treatment will etch the glass surface, generating roughness on a nanometer scale. This helps to improve adhesion of certain films and allows for better handling of the glass by increasing friction. In certain embodiments, display glass treated in this manner can improve electrostatic static discharge ("ESD") performance in customer TFT fabrication processes, and this treatment may have some benefit in improving customer TFT array uniformity.

In certain embodiments, glasses designed for display covers are chemically treated to improve their mechanical performance. To improve the strength of the display glass, a chemical treatment process includes subjecting the glass to a chemical solution of HF and $H_2SO_4$. Because HF attacks $SiO_2$ at a high rate, this chemical solution attacks mechanical flaws present on the glass surface, essentially smoothing them out. This reduces the severity of the flaws on the glass surface and enhances the strength of the glass. However, this treatment does not selectively remove metallic impurities from the glass.

A description of methods for forming top gate TFTs directly on a glass surface, wherein the glass surface is first adequately leached to provide a silica-rich boundary area at the glass surface, is described in U.S. Pat. No. 5,985,700, which is herein incorporated by reference. U.S. Pat. No. 5,985,700 describes a two-step leaching process using warm (75° C.) baths, involving a first base clean using $NH_4OH$, $H_2O$ and $H_2O_2$, and a second acid clean using HCl, $H_2O$ and $H_2O_2$. The base clean was found to remove organic materials, aluminum and calcium, while the acid clean was found to remove calcium, barium and residual aluminum. Top gate polysilicon TFTs were prepared using low temperature (about 600° C.) TFT fabrication process including directly depositing polysilicon on the leached substrate surface using low pressure CVD from a silane. Top gate TFTs were formed on substrates treated with the two-step leaching process and leached substrates that underwent a further HF etch at the end of the two-step leaching process.

Figure 1A:
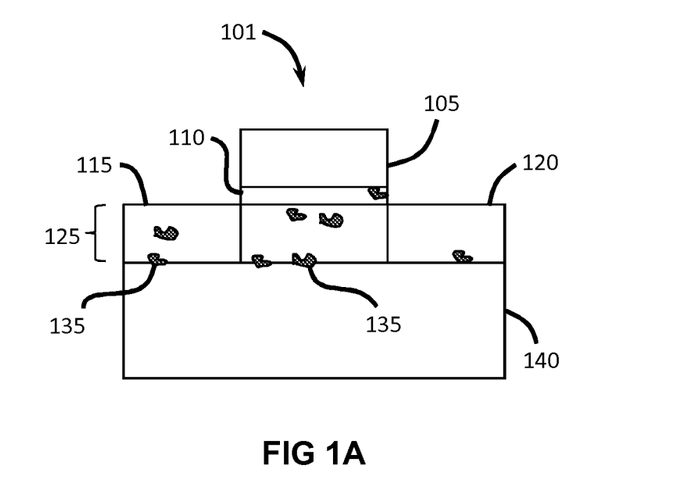
FIG. 1A is a schematic representation of a top-gate thin-film transistor ("TFT") fabricated on untreated display glass.
Figure 1B:
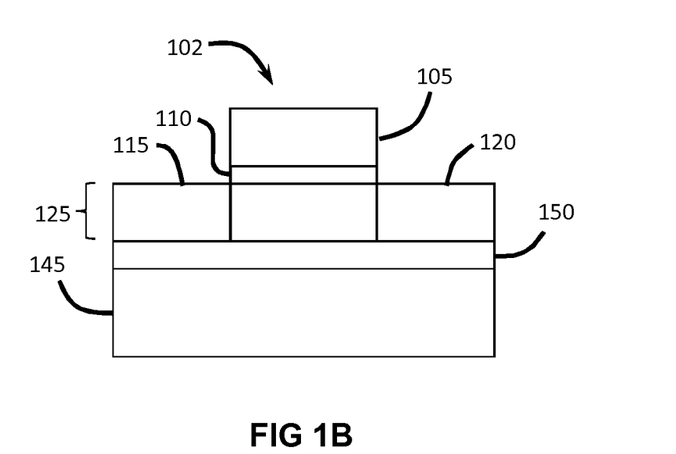
FIG. 1B is a schematic representation of a top-gate TFT fabricated on treated glass having a leached layer.

FIGS. 1A and 1B illustrate traditional 101 and inventive 102 top-gate TFT devices fabricated on display glass that has not been treated according to the chemical treatment process disclosed herein and glass that has been so treated and which comprises a leached depletion layer 150, respectively. As shown in FIG. 1A, in traditional top gate TFT devices 101, the active source 115 and drain 120 semiconductor regions of a semiconductor layer 125, which typically consist of intrinsic silicon, are in direct contact with the glass substrate. As a result, metallic impurities 135 present in the bulk glass substrate 140 can interact and be incorporated into the deposited semiconductor layer 125. Metallic impurities 135 at the glass/semiconductor interface may cause an increase in current leakage between the source 115 and drain 120. Metallic impurities 135 incorporated into the semiconductor layer 125 may reduce gate control and create unpredictable behavior. Furthermore, metallic impurities 135 incorporated in the gate insulator 110 can cause premature breakdown of the device.

Removal of these impurities from the top surface greatly reduces the chances of these degradation mechanisms from occurring. Referring to FIG. 1B, a top gate TFT 102 formed on a glass substrate treated according to the present disclosure has the active source 115 and drain 120 semiconductor regions of the semiconductor layer 125 in direct contact with a depletion/leached glass layer 150, which is depleted and/or substantially free of metallic impurities. This depletion/leached layer 150 provides a barrier that prevents the metallic impurities in the bulk glass substrate 145 from interacting and being incorporated into the deposited semiconductor layer 125. Metal layer 105 is the gate electrode.

It has been shown that a depletion/leached layer provides direct benefits to resulting device properties, including lower leakage current levels of thin-film transistors thereby improving off-state performance and reducing device power consumption. Similarly, it has been shown that substrates treated with the disclosed method lead to lower sub-threshold swing levels of thin-film transistors, thereby improving off-state performance, increasing switching speed and reducing device power consumption. Other improved properties in the resulting device include improved thin-film transistor threshold voltage stability. The aforementioned benefits may all lead to improved display and other electronic device performance as well as improved thin-film transistor and other electron device reliability. Finally, the disclosed method may lead to a direct improvement in sample-to-sample uniformity of thin-film transistor arrays, which can improve yield of customer products utilizing thin-film transistors.

The disclosure will be further clarified by the following non-limiting examples, which are intended to be purely exemplary of the invention.

EXAMPLE

This example describes an HCl leaching process and conditions used to generate an alkaline earth boroaluminosilicate glass (Corning Lotus™ low iron wafers) with a depleted surface layer. The glass wafer substrates used in the example had a diameter of 150 mm. Before leaching, the wafers were washed and dried.

The leaching was performed by dipping the wafers into a 1.5M HCl solution in a polytetrafluoroethylene ("PTFE") tank and soaking the wafers in the solution for varying temperatures and times. The experimental results are listed in Table 1 below, showing varied leaching temperatures and times used to leach Corning Lotus™ low Fe wafers with constant 1.5 M HCl solution ($HCl:H_2O=1:7$). Five different combinations of leaching temperature and time were used with a group of four wafers for each combination. For each group, three wafers were used for ringFET fabrication and TFT performance measurement, and one was used for glass surface characterization. Four untreated wafers were used as the controls. Before leaching, one acid tank was filled with 7 liters of 18 MΩ deionized water followed by 1 liter of Trace Metal grade HCl with a concentration of 34-37% to form a 1.5M HCl solution. The HCl solution was then heated to 40° C.

TABLE 1

| Leaching condition | Temperature (° C.) | Time (min) |
|---|---|---|
| A | 40 | 1 |
| B | 40 | 5 |
| C | 75 | 1 |
| D | 75 | 5 |
| E | 75 | 20 |

A slotted PTFE carrier loaded with four of the previously described glass wafers in different slots was dipped into the tank. After 1 minute of stagnant soaking, the carrier with wafers was taken out of the tank and placed in a rinse tank for three immediate cycles of quick dump rinse. The rinsed carrier and wafers subsequently went through a two-step post-cleaning process in an ultrasonic bath containing 18 MΩ deionized water. The first cleaning step was performed at a temperature of 50° C. and at an ultrasonic frequency of 72 kHz for 10 minutes, and the second cleaning step was performed at a temperature of 50° C. and at an ultrasonic frequency of 104 kHz for another 10 minutes. After post-cleaning, the wafers were dried by a spin-rinse and dry process ("SRD") in $N_2$ environment. Using the same procedure, another group of four Corning Lotus™ wafers were soaked in the same 1.5M HCl solution at 40° C. for 5 minutes. After 5 minutes of stagnant soaking, the carrier with wafers was taken out of the tank and placed in a rinse tank for three immediate cycles of quick dump rinse. The rinsed carrier and wafers subsequently underwent a two-step post-cleaning process in an ultrasonic bath containing 18 MΩ deionized water. The first cleaning step was performed at a temperature of 50° C. and at an ultrasonic frequency of 72 kHz for 10 minutes, and the second cleaning step was performed at 50° C. and at an ultrasonic frequency of 104 kHz for another 10 minutes. After post-cleaning, the wafers were dried by SRD under $N_2$ environment.

After that, the solution was further heated up to 75° C. Then, the same procedure was used to leach three more groups of Corning Lotus™ wafers with the same 1.5M HCl solution for 1, 5, and 20 minutes, respectively, followed by the same rinsing, post-cleaning and drying.

The four control wafers went through post-cleaning and drying process only.

The particle count analysis was conducted on the wafers using a Candela® CS10 optical surface analyzer (KLA-Tencor, Milpitas, Calif.) prior to and after leaching and post-cleaning. No noticeable increase in particle count was observed on each wafer. The leaching and post-cleaning processes typically do not generate particles because the surface is leached rather than etched, and results in selective removal of metals.

The surface composition of leached glass was analyzed by X-ray photoelectron spectroscopy (XPS). Two areas were measured for each wafer. The depletion layer was about 2 to about 5 nm deep. The results are shown in Table 2. Compared to the control, all leached glass wafers showed enrichment of silica and depletion of other elements.

Figure 2:
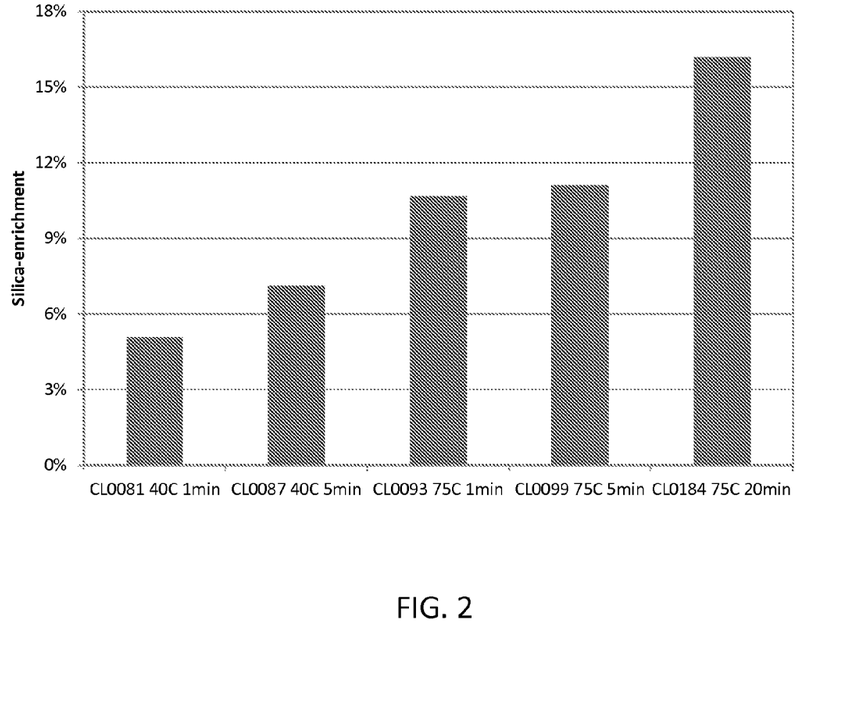
FIG. 2 is a bar graph showing silica-enrichment of the surface of glass wafers leached at different times and temperatures.

FIG. 2 is a bar-graph comparing silica-enrichment at the surface of five leached samples made using different treatment temperatures and times. The results were calculated based on the XPS data provided in Table 2 below. Without wishing to be bound by theory, it is believed that both higher temperature and longer leaching time enhance silica-enrichment at the surface, while temperature appears to be more influential than time. For a constant leaching time of one minute, the silica enrichment was increased from 5.1% to 10.7% by increasing the temperature from 40° C. to 75° C. At a constant leaching temperature of 75° C., the silica enrichment was increased from 10.7% to 11.1% by extending the leaching time from 1 min to 5 min.

Figure 3A:
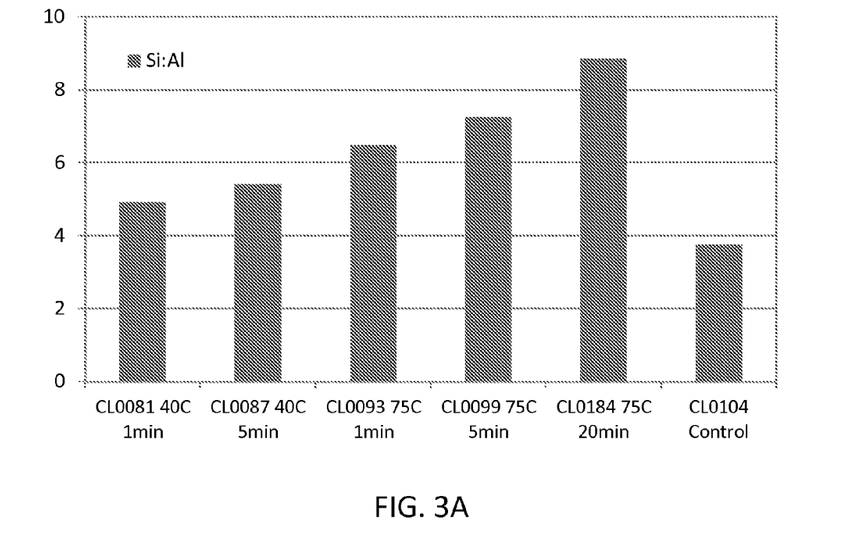
FIGS. 3A and 3B are bar graphs comparing surface ratios of silica to other elements of the control (unleached) with that of glass wafers leached at different leaching temperatures and times.
Figure 3B:
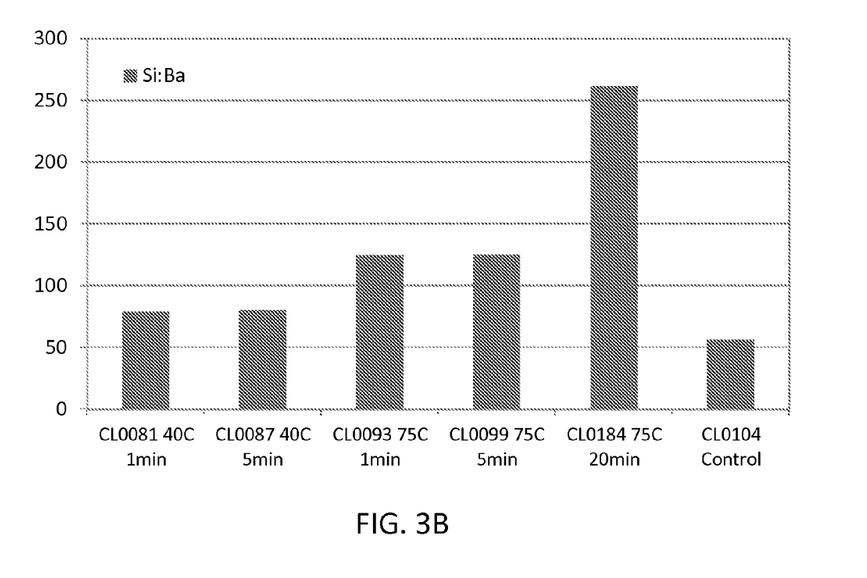

FIGS. 3A and 3B compare the ratios of Si to Al and Ba in the depletion layer of the unleached control glass wafers with that of the five leached glass wafers treated with the HCl solution at different temperatures and times. The ratios increase with leaching temperature and time, which is a result of a combination of depletion of other elements and Si-enrichment. FIG. 3A shows the ratio of Si to Al, while FIG. 3B shows the ratio of Si to Ba. The ratios were calculated based on the XPS data in Table 2 below showing XPS-determined surface compositions (in atomic %) of Corning Lotus™ Low Fe glass leached with 1.5M HCl as a function of time and temperature. Compositions are normalized to exclude surface contamination. A higher ratio of Si to other elements in the leached wafers as compared to that of the unleached control wafers indicates silica-enrichment and/or depletion of other elements on the glass surface.

TABLE 2

| Sample | Area | B | O | Mg | Al | Si | Ca | Sr | Ba |
|---|---|---|---|---|---|---|---|---|---|
| CL0081 | A1 | 1.7 | 67.8 | 0.1 | 4.8 | 24.1 | 0.8 | 0.4 | 0.3 |
| 40 C. 1 min | A2 | 1.9 | 68.4 | 0.2 | 4.8 | 23.2 | 0.9 | 0.4 | 0.3 |
| CL0087 | A1 | 1.9 | 68.4 | 0.2 | 4.4 | 23.8 | 0.9 | 0.3 | 0.3 |
| 40 C. 5 min | A2 | 1.3 | 68.0 | 0.1 | 4.5 | 24.4 | 1.0 | 0.4 | 0.3 |
| CL0093 | A1 | 1.1 | 68.8 | 0.1 | 3.9 | 24.8 | 0.8 | 0.3 | 0.2 |
| 75 C. 1 min | A2 | 1.2 | 68.7 | 0.2 | 3.8 | 25.0 | 0.6 | 0.3 | 0.2 |
| CL0099 | A1 | 1.4 | 69.3 | <0.1 | 3.4 | 25.0 | 0.6 | 0.3 | 0.2 |
| 75 C. 5 min | A2 | 1.5 | 68.8 | 0.1 | 3.5 | 25.0 | 0.7 | 0.3 | 0.2 |
| CL0184 | A1 | 0.8 | 69.2 | <0.1 | 2.9 | 26.1 | 0.6 | 0.2 | 0.1 |
| 75 C. 20 min | A2 | 1.1 | 69.1 | <0.1 | 3.0 | 26.2 | 0.4 | 0.2 | 0.1 |
| CL0104 | A1 | 2.0 | 67.3 | 0.2 | 6.0 | 22.6 | 1.2 | 0.4 | 0.4 |
| Control | A2 | 2.1 | 67.6 | 0.2 | 6.0 | 22.4 | 0.9 | 0.5 | 0.4 |

The atomic force microscopy ("AFM") surface roughness ("Ra") of a wafer was measured to be 0.25 nm before treatment. After being leached in 0.1M HCl at 50° C. for 1.5 hours, the measured Ra of the wafer was 0.27 nm. This difference in Ra was within the measurement error and therefore the surface roughness measurement indicated no change in surface roughness before and after leaching.

To characterize the electrical impact of the treated glass substrates, a ring field-effect transistor ("ringFET," TFT with concentric electrodes) device was used.

The ringFET device provides the ability to directly evaluate the electrical properties of the constituent materials that comprise the semiconductor-on-glass substrate and provide feedback for material and manufacturing process optimization. The existing pseudo-FET device that provides fast, direct evaluation of the virgin materials only works for silicon-on-insulator ("SOI") materials that consist of a semiconductor/insulator/semiconductor stack, where contacts can be made to the semiconductor on both sides of the insulator. This would not work for the semiconductor on glass substrate where there is not a second semiconductor on which to apply a contact. The ringFET design and process specifically target the limitations of the existing techniques for characterizing a substrate with a relatively thick (tens to hundreds of microns) glass layer. The ringFET device has three concentric, co-planar electrodes that comprise the source, gate and drain of a ring field-effect transistor.

The ringFET allows for all typical TFT parameters to be measured and characterized without having to run a full TFT transistor fabrication process like those found in manufacturing. For this analysis, ringFETs were fabricated on leached glass surfaces.

The transistors used to gather the data in FIG. 4 through FIG. 7 were fabricated by first depositing an amorphous silicon ("a-Si") layer directly on Corning Lotus™ glass at 400° C. in a plasma enhanced chemical vapor deposition ("PECVD") reactor. The a-Si layer was then annealed at 630° C. for 12 hrs in a $N_2$ atmosphere to form a polycrystalline silicon ("p-Si") layer. 250 nm Al was deposited via sputtering, patterned using photolithography and etch to form source/drain electrodes. A 100 nm blanket $SiO_2$ layer was then deposited over the channel regions and the source/drain electrodes from a tetra-ethyl-ortho-silicate ("TEOS") gas precursor in the PECVD chamber at 390° C. 250 nm Al was deposited via sputtering, patterned using photolithography and etch to form the gate electrode. Via holes were etched through $SiO_2$ gate oxide over the source and drain electrodes to allow electrical contact to be made. The sample was then annealed at 450° C. for 1 hour in a 200 mTorr $N_2$ environment. This causes the Al source/drain electrodes to react with the silicon, thus forming the p-type doped source/drain regions of the transistor.

All TFT characteristics were measured at room temperature. Fifty-two sites on each wafer were measured where the wafer was subjected to a particular chemical treatment. There were multiple (≥3) wafers for each treatment, so that within wafer and wafer-to-wafer variations could be measured, which helped to account for process noise generated during TFT fabrication and create a stronger signal of the experimental treatment conditions which can be extracted through statistical methods. The transistor data illustrated in FIG. 4 through FIG. 7 show that treating the glass with HCl acid to form a leached layer helps improve TFT off-state characteristics.

Figure 4:
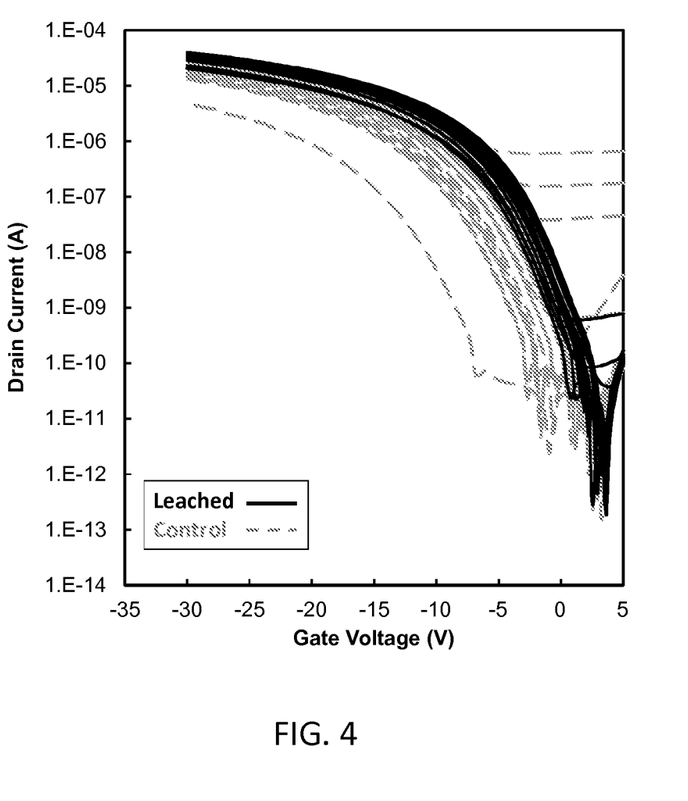
FIG. 4 is a graph showing TFT $I_D$-$V_G$ transfer characteristics on untreated (dashed) and treated (solid) Corning Lotus™ glass.

For example, FIG. 4 shows TFT $I_D$-$V_G$ transfer characteristics on untreated (dashed) and treated (solid) Corning Lotus™ glass. For each case, the number of curves is 45 (n=45). It can clearly be seen that the treated sample shows less variability.

Figure 5:
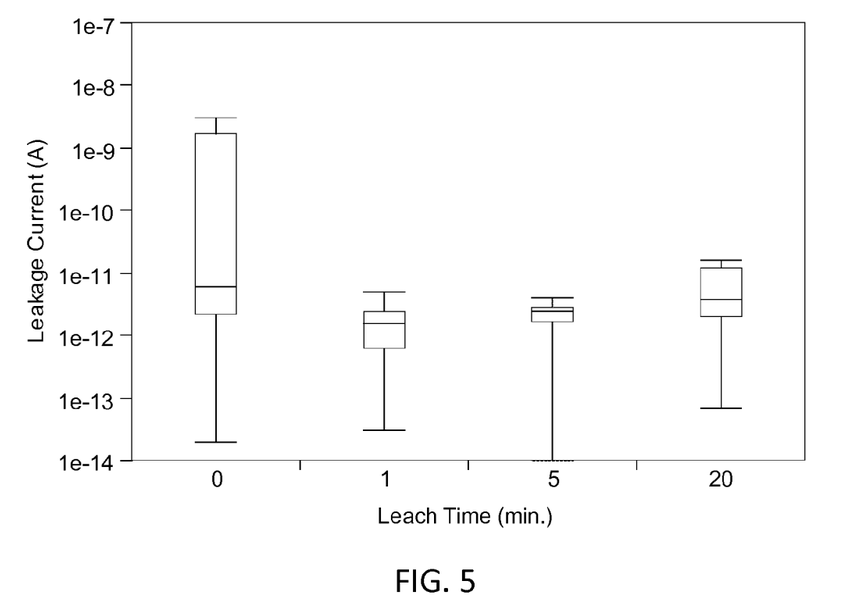
FIG. 5 is a box plot showing the effects of a 1:7 $HCl:H_2O$ leaching solution on TFT leakage current as a function of treatment time at 75° C. in a non-recirculating bath.

FIG. 5 illustrates box plots showing the effects of a 1:7 $HCl:H_2O$ leaching solution on TFT leakage current as a function of treatment time at 75° C. in a non-recirculating bath. Corning Lotus™ glass was used. The untreated control sample is represented by time=0. Untreated glass (time=0 min.) exhibits a high median with a larger variation in the leakage current. For treatment times >0, the median leakage current drops and the variation decreases. For longer treatment times, variation and median leakage current increase, most likely due to re-deposition of contaminants on the surface because the solution was not recirculated.

Figure 6:
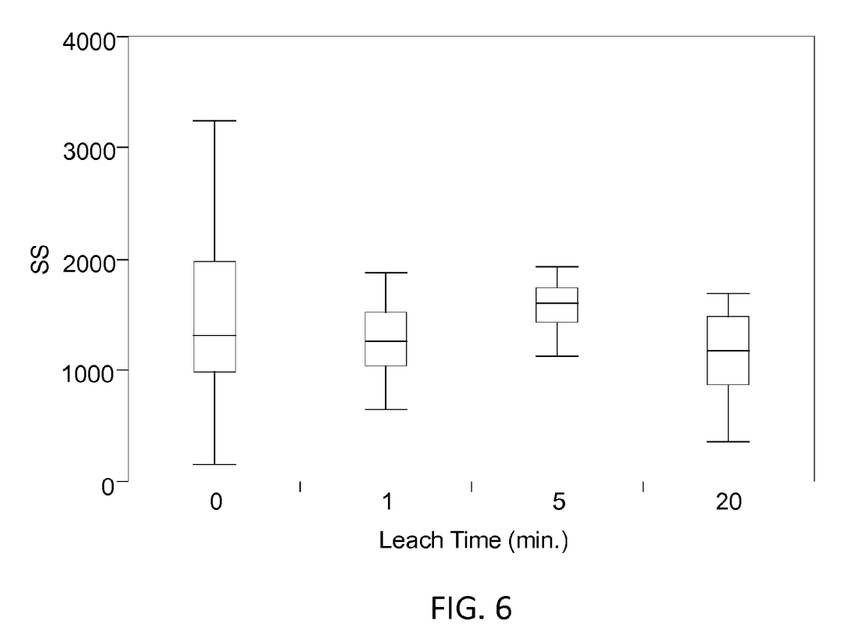
FIG. 6 is a box plot showing the effects of a 1:7 $HCl:H_2O$ leaching solution on TFT sub-threshold swing (mV/dec) current as a function of treatment time at 75° C. in a non-recirculating bath.

FIG. 6 illustrates box plots showing the effects of a 1:7 $HCl:H_2O$ leaching solution on TFT sub-threshold swing ("SS") current (mV/dec) as a function of treatment time at 75° C. in a non-recirculating bath. Corning Lotus™ glass was used. The untreated control sample is represented by time=0. In general, the variation in sub-threshold swing is reduced after any amount of treatment time.

Figure 7:
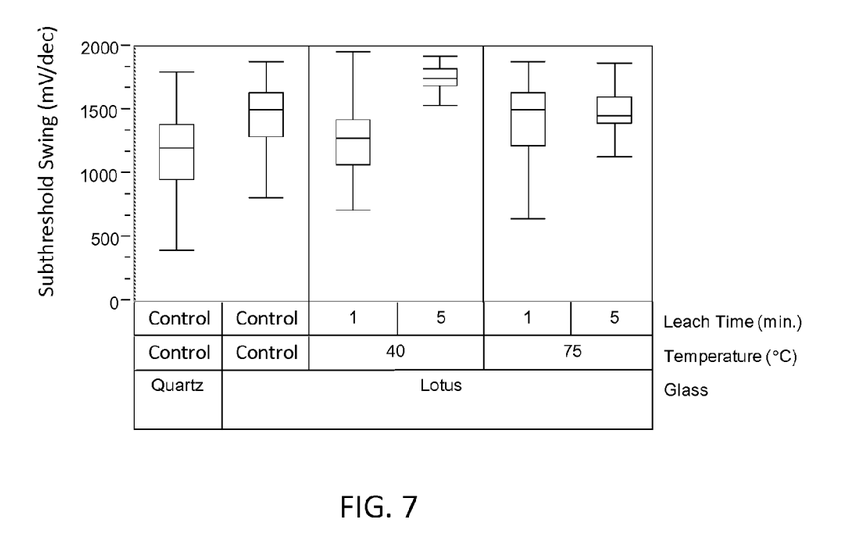
FIG. 7 is a box plot showing a sub-threshold swing of treated and untreated Corning Lotus™ glass compared to quartz substrates having no metal impurities for various leaching times and temperatures.

FIG. 7 is a graph showing sub-threshold swing (SS) of treated and untreated Corning Lotus™ glass compared to quartz substrates having no metal impurities for various leach times and temperatures. Untreated Corning Lotus™ glass has a high SS as compared to quartz. Treating Corning Lotus™ glass for short times at 40° C. brings its SS performance close to that of quartz while also reducing the variation. Untreated controls are represented by time=0 and temperature=40° C. and 75° C.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred.

It is to be understood that the foregoing description is exemplary and explanatory only, and is not to be interpreted as restrictive of the disclosure. Moreover, it should be understood that various features and/or characteristics of differing embodiments herein may be combined with one another. Therefore modifications and variations may be made to the illustrative embodiments and other arrangements may be devised without departing from the spirit or scope of the invention. Since modifications combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A method of chemically treating the surface layer of a glass substrate, said method comprising:
   contacting at least one surface of the substrate with a heated solution comprising HCl for a time and at a temperature sufficient to leach at least one element from a surface layer below the surface of the glass substrate; and
   wherein the surface roughness of the glass substrate is substantially the same before and after the contacting step;
   wherein the at least one element is chosen from the group consisting of alkaline earth metals, boron, aluminum, and metallic contaminants; and
   wherein a depth of the surface layer ranges from about 1 nm to about 200 nm.

2. The method of claim 1, wherein said glass substrate comprises an alkaline earth boroaluminosilicate glass.

3. The method of claim 2, wherein the at least one element is chosen from the group consisting of Na, K, Mg, Ca, Sr, Ba, Fe, Cu, B, Al, Sn, P, As, Sb, and combinations thereof.

4. The method of claim 2, wherein the chemically treated glass substrate has a silica enrichment ranging from 4 to 15% after said contacting step.

5. The method of claim 2, wherein the chemically treated glass substrate has a Si:Al ratio at least 20% higher after said contacting step.

6. The method of claim 1, wherein the HCl solution has a concentration in a range from 0.1 mole per liter to 2.0 mole per liter.

7. The method of claim 6, wherein the HCl solution is diluted with a diluent selected from $H_2O$ or $H_2O_2$.

8. The method of claim 7, wherein the ratio of HCl to diluent ranges from 1:5 to 1:10.

9. The method of claim 1, wherein the solution temperature ranges from 40° C. to 80° C.

10. The method of claim 1, wherein the contacting time ranges from 1 minute to 30 minutes.

11. The method of claim 1, wherein the substrate is washed and cleaned prior to said contacting step.

12. The method of claim 1, wherein said contacting step comprises a stagnant soak or an agitated soak.

13. The method of claim 1, wherein said contacting comprises a horizontal or vertical spray process.

14. The method of claim 1, further comprising at least one post-leach washing step comprising contacting the chemically treated substrate with heated, deionized water under ultrasonication conditions.

15. The method of claim 14, wherein the deionized water is heated to a temperature ranging from 40° C. to 80° C.

16. The method of claim 14, wherein ultra-sonication occurs at a frequency ranging from 70 kHz to 1000 kHz for 5 minutes to 20 minutes.

17. The method of claim 14, wherein the leached and cleaned glass is dried with use of spin-rinse-drying ("SRD"), isopropanol ("IPA") drying, or combinations thereof.

18. The method of claim 1, further comprising forming a TFT by:

depositing a semiconductor layer comprising a material selected from the group consisting of Si, metal oxides, group III-V elements, group II-VI elements, organics, and combinations thereof directly on the chemically treated surface of the glass substrate;

annealing the Si layer to form polycrystalline silicon;

depositing electrodes on the polycrystalline silicon, and patterning the electrodes to form channel regions;

depositing a $SiO_2$ layer over the channel regions and the electrodes;

depositing an Al gate on the $SiO_2$ layer, and patterning the gate;

etching via holes through the $SiO_2$ layer and over the electrodes to form a TFT; and annealing the TFT.

* * * * *